US008610293B2

United States Patent
Shiobara et al.

(10) Patent No.: US 8,610,293 B2
(45) Date of Patent: Dec. 17, 2013

(54) RESIN COMPOSITION FOR ENCAPSULATING OPTICAL SEMICONDUCTOR ELEMENT AND OPTICAL SEMICONDUCTOR DEVICE

(75) Inventors: Toshio Shiobara, Tokyo (JP); Tsutomu Kashiwagi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 368 days.

(21) Appl. No.: 12/967,746

(22) Filed: Dec. 14, 2010

(65) Prior Publication Data
US 2011/0140289 A1 Jun. 16, 2011

(30) Foreign Application Priority Data
Dec. 15, 2009 (JP) .................. 2009-283736

(51) Int. Cl.
*H01L 23/29* (2006.01)
*H01L 23/28* (2006.01)
*H01L 31/0203* (2006.01)
*H01L 33/00* (2010.01)

(52) U.S. Cl.
USPC ........... 257/789; 257/100; 257/433; 257/787; 257/791

(58) Field of Classification Search
USPC .................. 257/787–796, 100, 433, 434, 667
See application file for complete search history.

(56) References Cited

U.S. PATENT DOCUMENTS

| 2008/0160322 | A1 | 7/2008 | Mochizuki et al. | |
| 2009/0246355 | A9* | 10/2009 | Lower et al. | 427/58 |
| 2010/0224906 | A1* | 9/2010 | Kashiwagi et al. | 257/100 |
| 2010/0270664 | A1* | 10/2010 | Lee et al. | 257/666 |

FOREIGN PATENT DOCUMENTS

| EP | 0 441 622 A1 | 8/1991 |
| EP | 1 529 807 A2 | 5/2005 |
| JP | 58-29858 A | 2/1983 |
| JP | 3-241338 A | 10/1991 |
| JP | 7-25987 A | 1/1995 |
| JP | 2001-2922 A | 1/2001 |
| JP | 2008-162849 A | 7/2008 |
| JP | 2009-235265 A | 10/2009 |
| WO | 2006/077667 A1 | 7/2006 |

OTHER PUBLICATIONS

European Search Report issued Jan. 25, 2011, in European Patent Application No. 10015632.

* cited by examiner

*Primary Examiner* — Chuong A. Luu
(74) *Attorney, Agent, or Firm* — Birch, Stewart, Kolasch & Birch, LLP

(57) ABSTRACT

A resin composition containing a silica-based filler which differs in refractive index by ±0.03 from the curable base resin and has a thermal conductivity no lower than 0.5 W/m·K, and a light-emitting diode encapsulated with said resin composition. The resin composition is preferably prepared from a curable silicone resin which imparts a cured product having a refractive index of 1.45 to 1.55 and cristobalite powder dispersed therein.

10 Claims, 1 Drawing Sheet

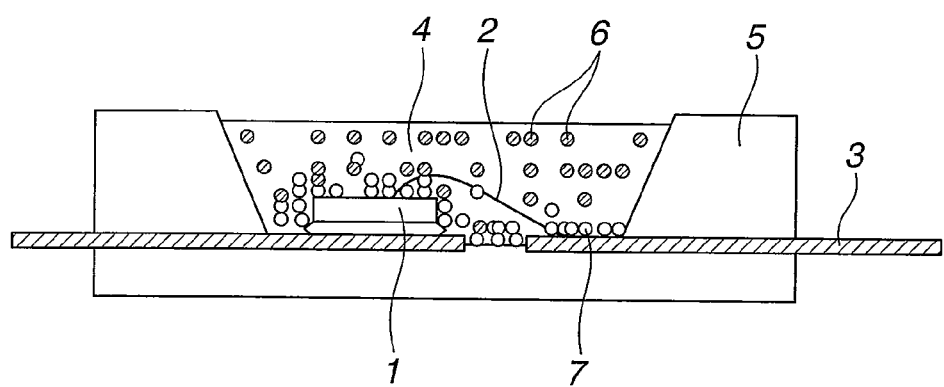

RESIN COMPOSITION FOR ENCAPSULATING OPTICAL SEMICONDUCTOR ELEMENT AND OPTICAL SEMICONDUCTOR DEVICE

CROSS-REFERENCE TO RELATED APPLICATION

This non-provisional application claims priority under 35 U.S.C. §119(a) on Patent Application No. 2009-283736 filed in Japan on Dec. 15, 2009, the entire contents of which are hereby incorporated by reference.

TECHNICAL FIELD

The present invention relates to a resin composition for encapsulating an optical semiconductor element. More particularly, the present invention relates to a resin composition for encapsulating an optical semiconductor element imparting a cured product having good transparency and thermal conductivity and also to an optical semiconductor device encapsulated with a cured product of the resin composition.

BACKGROUND ART

Any resin composition for coating and protecting optical semiconductor elements such as light-emitting diodes (LED) is required to give a transparent cured product. The composition comprising an epoxy resin such as bisphenol-A type or an alicyclic epoxy resin and an acid anhydride curing agent has been generally used. (See Japanese Patent No. 3241338 and JP-A H7-25987.)

The conventional transparent epoxy resin, however, is poor in light resistance on account of its low transmittance for short-wave light or liable to discoloration due to light-induced degradation. To solve this problem, there have been proposed a resin composition for coating and protecting for an optical semiconductor element comprising an alkenyl group-containing silicon compound having at least two carbon-carbon double bonds in one molecule, a silicon compound having at least two SiH groups in one molecule, and a hydrosilylating catalyst. (See JP-A 2001-002922 and WO 2006/77667.)

However, such a cured product of the silicone composition, especially a cured product of the silicone composition having a refractive index of up to 1.45, has a drawback that the cured product has a large gas permeability and hence permit permeation of sulfide gas existing in the storage and operation environment, when compared with the conventional epoxy resin compositions. Thus, the sulfide gas permeating the silicone cured product would react with the silver-plated surface of a lead frame substrate of LED package, thereby changing the plated silver to silver sulfide by sulfide reaction, resulting in blackening of the silver-plated surface.

Recently, LEDs have become brighter than before in proportion to the increasing current supplied to them. This leads to a considerable heat generation from the chip to such an extent that heat dissipation only from the lead frame is not enough to keep the junction temperature low. The resulting high temperature brings about degradation of encapsulated resin and die-bonding resin, which is responsible for short-lived LEDs.

There has recently been proposed a way of solving the above-mentioned problem with sulfidization of silver-plated surface by using a silicone cured product having a refractive index of at least 1.45 which has a comparatively small gas permeability. However, this silicone cured product is still subject to discoloration because the recent light-emitting elements are intended for high emitting efficiency accompanied by high heat generation.

The light-emitting semiconductor device such as white LED is usually composed of a die pad of reflector having a lead frame and a light-emitting element supported thereon, which are encapsulated with a thermosetting resin such as silicone resin containing a fluorescent substance. The light-emitting element such as LED generates intense light and high heat. The light and heat degrade the encapsulated resin near the element although heat dissipates through the lead frame. This phenomenon is conspicuous particularly on the element's surface where there exists the fluorescent substance. The encapsulated resin in contact with the element's surface easily deteriorates because it receives an intense light and accumulates heat.

SUMMARY OF INVENTION

An object of the present invention is to provide a resin composition for encapsulating an optical semiconductor device which imparts a cured product having good heat conductivity and high transparency as well as giving excellent dissipating effect that the heat generated from a light-emitting element can be dissipated not only from a lead frame but only from an encapsulated resin surface. Another object is to provide an optical semiconductor device encapsulated with the resin composition.

The present inventors carried out intensive investigations to find out that the above object is achieved if a resin composition for encapsulating an optical semiconductor element is formed from a curable resin composition and a specific silica-based filler which differs in refractive index by ±0.03 from the cured product of the curable resin composition (without filler) and has a thermal conductivity of at least 0.5 W/m·K.

Accordingly, the present invention provides the following resin composition for encapsulating an optical semiconductor element and an optical semiconductor device encapsulated with the resin composition.

[1] A resin composition for encapsulating an optical semiconductor element comprising a curable resin composition and a silica-based filler which differs in refractive index by ±0.03 from a cured product of the curable resin composition and has a thermal conductivity of at least 0.5 W/m·K.

[2] The resin composition of [1] which further comprises a fluorescent substance.

[3] The resin composition of [1] or [2] wherein the content of the silica-based filler is 5 to 150 parts by weight for 100 parts by weight of the curable resin composition.

[4] The resin composition of any one of [1] to [3] wherein the silica-based filler has a refractive index of 1.45 to 1.55.

[5] The resin composition of any one of [1] to [4] wherein the silica-based filler has a cristobalite structure.

[6] The resin composition of [5] wherein the silica-based filler having the cristobalite structure has a particle size of 0.01 to 75 μm and a sphericity of 0.8 to 1.0.

[7] The resin composition of any one of [1] to [6] wherein the curable resin composition is a curable silicone rubber composition.

[8] The resin composition of [7] wherein the curable resin composition is an addition-curable silicone rubber composition.

[9] An optical semiconductor device in which an optical semiconductor element is encapsulated with a cured product of the resin composition of any one of [1] to [8].

ADVANTAGEOUS EFFECTS OF INVENTION

According to the present invention, the resin composition for encapsulating an optical semiconductor element imparts a cured product which permits efficient heat dissipation and prevents the deterioration of reflectivity and brightness due to the discoloration of silver by sulfidization and which withstands thermal stress test such as reflow with moisture absorption and thermal shock test, thereby ensuring a long-term reliability.

BRIEF DESCRIPTION OF THE DRAWING

FIG. 1 is a schematic sectional view showing one embodiment of the LED device pertaining to the present invention.

DESCRIPTION OF EMBODIMENTS

According to the present invention, the resin composition for encapsulating an optical semiconductor element is composed of a curable resin composition and a specific silica-based filler incorporated therein.

The curable resin composition used for the present invention includes an epoxy resin composition composed mainly of an alicyclic epoxy resin, a resin composition composed of a composite resin of an epoxy resin and a silicone resin, and a silicone rubber composition of condensation curable type or heat curable type. Preferable among them is an addition curable silicone rubber composition consisting of the following components:

(A) an organic silicon compound having noncovalent double bonds; particularly, an organopolysiloxane having two or more alkenyl groups in one molecule,
(B) an organohydrogenpolysiloxane,
(C) a platinum catalyst,
(D) a reaction inhibitor, and
(E) a silane coupling agent.

Component (A)

Component (A) is an organopolysiloxane represented by the following general formula (1):

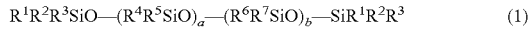

$$R^1R^2R^3SiO\text{---}(R^4R^5SiO)_a\text{---}(R^6R^7SiO)_b\text{---}SiR^1R^2R^3 \quad (1)$$

wherein $R^1$ denotes a monovalent hydrocarbon group having noncovalent double bonds, $R^2$ to $R^7$ denote identical or different monovalent hydrocarbon groups, more specifically each of $R^4$ to $R^7$ denotes a monovalent hydrocarbon group having no aliphatic unsaturated bond, and $R^6$ and/or $R^7$ denotes an aliphatic monovalent hydrocarbon group, and a and b are integers defined by $0 \le a+b \le 500$, preferably $10 \le a+b \le 500$; $0 \le a \le 500$, preferably $10 < a \le 500$; and $0 \le b \le 250$, preferably $0 \le b \le 150$.

In the above formula, $R^1$ should preferably be an aliphatic unsaturated group such as an alkenyl group having 2 to 6 carbon atoms. Each of $R^2$ to $R^7$ should preferably be has 1 to 20 carbon atoms, preferably 1 to 10 carbon atoms. Examples of $R^2$ to $R^7$ include an alkyl group, alkenyl group, aryl group, or aralkyl group. Preferable among them are an alkyl group, aryl group, and aralkyl group, which do not have aliphatic unsaturated bonds unlike alkenyl groups. $R^6$ and/or $R^7$ should preferably be an aromatic monovalent hydrocarbon group such as an aryl group having 6 to 12 carbon atoms including phenyl group, tolyl group.

The organopolysiloxane represented by formula (1) above can be obtained by alkali equilibrating reaction between cyclic diorganopolyiloxane and disiloxane, the former including cyclic diphenylpolysiloxane and cyclic methylphenylpolysiloxane as the constituent of the main chain and the latter including diphenyltetravinyldisiloxane and divinyltetraphenyldisiloxane as the constituent of the terminal group. The foregoing siloxanes usually do not contain silanol groups and chlorine.

The following are the typical examples of the organopolysiloxane represented by formula (1) above.

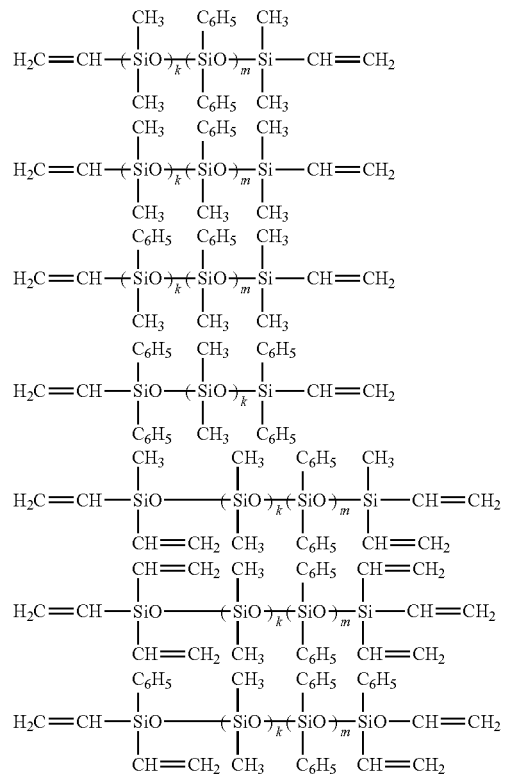

where, k and m are integers that satisfy $0 \le k+m \le 500$, preferably $5 < k+m \le 250$, and $0 \le m/(k+m) \le 0.5$.

As component (A), the organopolysiloxane of straight-chain structure represented by formula (1) above may be used in combination with an organopolysiloxane of three-dimensional network structure containing three-functional siloxane units or four-functional siloxane units, according to need.

The content of noncovalent double bonds such as an alkenyl group in component (A) should be 1 to 50 mol %, preferably 2 to 40 mol %, more preferably 5 to 30 mol %, of the total amount of monovalent hydrocarbon groups ($R^1$ to $R^7$). With a content less than 1 mol %, the cured product is not obtained as desired. With a content more than 50 mol %, the resulting cured product is poor in mechanical properties.

The content of aromatic groups in component (A) should be 0 to 95 mol %, preferably 10 to 90 mol %, more preferably 20 to 80 mol %, of the total amount of monovalent hydrocarbon groups ($R^1$ to $R^7$). An adequate amount of aromatic groups in the resin contributes to good mechanical properties and good processability. Moreover, aromatic groups help control the refractive index.

Component (B)

Component (B) is an organohydrogenpolysiloxane having two or more hydrogen atoms attached to a silicon atom (i.e., SiH group) in one molecule. It functions as a crosslinking agent for addition reaction between the SiH group and the noncovalent double bond such as the alkenyl group (typically, vinyl group) in component (A). The addition reaction yields the cured product.

The organohydrogenpolysiloxane may have one or more aromatic hydrocarbon groups so that it is highly compatible with component (A) having a high refractive index and it yields a transparent cured product. Therefore, component (B) may be composed partly or entirely of organohydrogenpolysiloxane having one or more aromatic monovalent hydrocarbon groups.

The organohydrogenpolysiloxane may have any molecular structure, such as linear, cyclic, branched, and three-dimensional network. In addition, it may have 2 to 1000, preferably 2 to 300 silicon atoms in one molecule. The number of silicon atoms represents the degree of polymerization.

Typical examples of the organohydrogenpolysiloxane are listed below.
1,1,3,3-tetramethyldisiloxane,
1,3,5,7-tetramethylcyclotetrasiloxane,
tris(dimethylhydrogensiloxy)methylsilane,
tris(dimethylhydrogensiloxy)phenylsilane,
1-glycidoxypropyl-1,3,5,7-tetramethylcyclotetrasiloxane,
1,5-glycidoxypropyl-1,3,5,7-tetramethylcyclotetrasiloxane,
1-glycidoxypropyl-5-trimethylsilylethyl-1,3,5,7-tetramethyl-cyclotetrasiloxane,
methylhydrogenpolysiloxane having both ends blocked with trimethylsiloxy groups,
dimethylsiloxane-methylhydrogensiloxane copolymer having both ends blocked with trimethylsiloxy groups,
dimethylpolysiloxane having both ends blocked with dimethylhydrogensiloxy groups,
dimethylsiloxane-methylhydrogensiloxane copolymer having both ends blocked with dimethylhydrogensiloxy groups,
methylhydrogensiloxane-diphenylsiloxane copolymer having both ends blocked with trimethylsiloxy groups,
methylhydrogensiloxane-diphenylsiloxane-dimethylsiloxane copolymer having both ends blocked with trimethylsiloxy groups,
trimethoxysilane polymer,
copolymer composed of $(CH_3)_2HSiO_{1/2}$ unit and $SiO_{4/2}$ unit, and
copolymer composed of $(CH_3)_2HSiO_{1/2}$ unit, $SiO_{4/2}$ unit, and $(C_6H_5)SiO_{3/2}$ unit.

Additional examples of the organohydrogenpolysiloxane are those which are composed of such structural units as shown below.

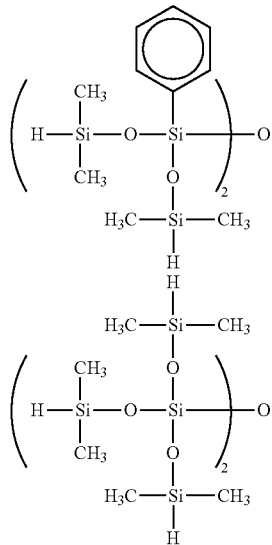

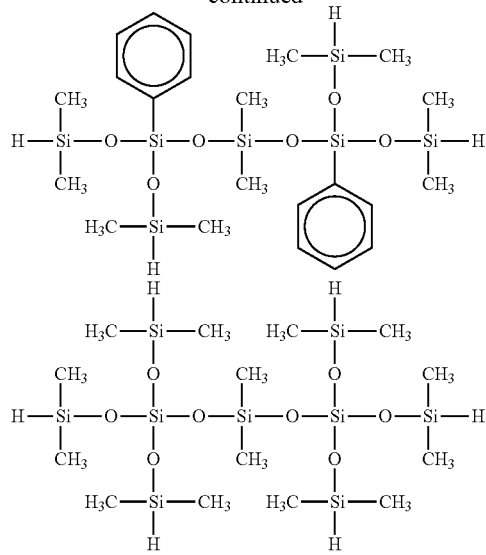

The organohydrogenpolysiloxane should preferably be incorporated into the resin composition in an amount sufficient to provide 0.7 to 3.0 of SiH groups in component (B) per noncovalent double bond (typically alkenyl group) in component (A).

Component (C)

Component (C) is a platinum catalyst, which includes chloroplatinic acid, alcohol-modified chloroplatinic acid, and platinum complex of chelate structure. They may be used alone or in combination with one another.

Component (C) should be used in a catalytic amount which is effective for curing, and preferably be 0.1 to 500 ppm, more preferably 0.5 to 100 ppm in terms of platinum for 100 parts by weight of the total amount of components (A) and (B).

Component (D)

Component (D) is a reaction inhibitor (cure regulator) which can impart storage stability to the composition. Any reaction inhibitors are used so long as they can inhibit the progress of curing upon storage. Examples of the reaction inhibitors include acetylene alcohol or its derivatives, triallylisocyanurate or its derivatives, alkyl maleates, hydroperoxides tetramethyl ethylenediamine, benzotriazol, and mixtures thereof. Acetylene alcohol or its derivatives and triallylisocyanurate or its derivatives are preferred because they do not injure the curability of the composition and imparts excellent storage stability to the composition.

The amount of the reaction inhibitor is 1 to 10,000 ppm, preferably 5 to 5,000 ppm for the total amount of the addition curable silicone rubber composition.

Component (E)

Component (E) is a silane coupling agent which is optionally incorporated for imparting adhesive properties. Examples of the silane coupling agents include:
vinyltrimethoxysilane, vinyltriethoxysilane,
2-(3,4-epoxycyclohexyl)ethyltrimethoxysilane,
3-glycidoxypropyltrimethoxysilane,
3-glycidoxypropylmethyldiethoxysilane,
3-glycidoxypropyltriethoxysilane,
3-mathacryloxypropylmethyldimethoxysilane,
3-methacryloxypropyltrimethoxysilane,
3-methacryloxypropylmethyldiethoxysilane,
3-methacryloxypropyltriethoxysilane,
N-2(ethylamino)3-aminopropylmethyldimethoxysilane, N-2(ethylamino)3-aminopropyltrimethoxysilane,
N-2(ethylamino)3-aminopropyltriethoxysilane,
3-aminopropyltrimethoxysilane, 3-aminopropyltriethoxysilane,
N-phenyl-3-aminopropyltrimethoxysilane, and
3-mercaptopropyltrimethoxysilane. Additional examples include trimethoxysilane and tetramethoxysilane and oligomers thereof. These silane coupling agents may be used alone or in combination with one another.

The amount of the silane coupling agent should be no more than 10 wt %, preferably no more than 5 wt %, (both including zero) for the total amount of the addition curable silicone rubber composition. In case of incorporating the silane coupling agent, the amount is preferably 0.1 wt % or more.

Component (F)

In the resin composition according to the present invention, component (F) is incorporated into the curable resin composition, particularly the silicone rubber composition of addition-curable type consisting of components (A) to (E). Component (F) is a silica-based filler which differs in refractive index by ±0.03 from the cured product of the resin composition, particulary the silicone rubber composition of addition-curable type and has a thermal conductivity of up to 0.5 W/m·K, preferably 0.5 to 2.0 W/m·K.

The above-mentioned curable composition, particularly the silicon rubber composition of addition-curable type, yields a cured product which varies in refractive index depending on the ratio of alkyl groups such as methyl groups to aryl groups such as phenyl groups attached to the silicon atoms. The cured product has a refractive index of about 1.4 to 1.6. Therefore, the silica-based filler should preferably have a refractive index of 1.45 to 1.55 so that the above-mentioned requirement ±0.03 in difference is satisfied.

Examples of the silica-based filler include silica powder such as cristobalite, tridymite, quartz, and keatite and silicon-metal complex oxide such as aluminosilicate. The silica-based filler should be in the form of powder having a particle size of 0.01 to 75 μm and a mean particle diameter of 1 to 30 μm, preferably 0.5 to 25 μm, more preferably 1 to 15 μm. The powder may have any shape ranging from irregular (as crushed) to spherical. It should preferably be spherical, with sphericity being 0.8 to 1.0. Incidentally, the particle size is measured by a particle size distribution measuring apparatus that employs the laser beam diffraction method. The mean particle diameter is expressed in terms of cumulative weight-average value $D_{50}$ (or median diameter) measured by a particle size distribution measuring apparatus that employs the laser beam diffraction method. The sphericity is expressed as a ratio of A/B wherein A is the longest major axis and B is the shortest minor axis of the powder in SEM (scanning transmission electron microscope) observation.

Among the silica-based fillers described above, spherical cristobalite is particularly preferable. Cristobalite is usually available in the form of irregular grains (as crushed). However, spherical cristobalite can be produced from fused silica by the method disclosed in JP-A 2008-162849. This method permits fused silica to turn into cristobalite while keeping its shape and particle size distribution.

The silica-based filler should preferably be added in an amount of 5 to 150 parts by weight, preferably 10 to 100 parts by weight for 100 parts by weight of the above-mentioned curable resin composition. With an amount less than 5 parts by weight, it does not fully produce the heat dissipating effect. With an amount in excess of 150 parts by weight, it impairs workability due to increased viscosity.

The resin composition for encapsulating an optical semiconductor element according to the present invention is useful to encapsulate LED elements, particularly those of blue, white, and violet. The blue LED emits white light when incorporated with a fluorescent powder selected from any known ones listed below.

Garnet represented by the general formula $A_3B_5O_{12}$:M (where, A denotes at least one element selected from the group consisting of Y, Gd, Tb, La, Lu, Se, and Sm; B denotes at least one element selected from the group consisting of Al, Ga, and In; and M denotes at least one element selected from the group consisting of Ce, Pr, Eu, Cr, Nd, and Er.) This is suitable for yellow light emission.

Fluorescent substance represented by $Y_3Al_5O_{12}$:Ce and/or $(Y, Gd, Tb)_3(Al, Ga)_5O_{12}$:Ce. This is suitable for white light emission.

Other fluorescent substances represented by $CaGa_2S_4$:$Ce^{3+}$, $SrGa_2S_4$:$Ce^{3+}$, $YAlO_3$:$Ce^{3+}$, $YGaO_3$:$Ce^{3+}$, $Y(Al, Ga)O_3$:$Ce^{3+}$, and $Y_2SiO_5$:$Ce^{3+}$.

Mixed color light is produced by aluminate or orthosilicate doped with rare earth element. The resin composition according to the present invention may be incorporated with one of these fluorescent substances in an amount of 1 to 50 parts by weight for 100 parts by weight of the resin composition, for conversion of blue light into white light.

The resin composition for encapsulating an optical semiconductor element according to the present invention may contain a variety of additives as listed below in an amount not harmful to the performance of the optical semiconductor device.

Antioxidants: BHT and vitamin B
Anti-discoloration agent:
  organophosphorus ones
Anti-photodegradation agent:
  hindered amine
Reactive diluent: vinyl ether, vinylamide, epoxy resin, oxetane, allyl phthalate, and vinyl adipate.
Reinforcing silica: fumed silica and precipitated silica.
Flame retardancy improver
Fluorescent substance
Organic solvent
Coloring agent The resin composition for encapsulating an optical semiconductor element can be prepared by evenly mixing the above components. The resin composition may be prepared and stored as a two-part system, when used, they are mixed. In this case, component (B) and component (C) are separately stored. The resin composition may be prepared as a one-part system by incorporating the reaction inhibitor to the composition.

The resin composition according to the present invention is used to encapsulate varies optical semiconductor elements which are not specifically restricted. They include, for example, light-emitting diode, phototransistor, photodiode, CCD, solar cell module, EPROM, and photocoupler. Light-emitting diodes are most suitable.

Encapsulation or sealing may be accomplished in the usual way adopted for individual semiconductors. After encapsulation, the resin composition is cured at room temperature to about 200° C. for tens of seconds to several days, preferably at 80 to 180° C. for 1 minute to 10 hours.

FIG. 1 shows one example of the LED light-emitting device which is encapsulated with the resin composition of the present invention. The LED is made up of (1) LED chip, (2) conductive wire, (3) silver-plated lead frame, (4) cured product of the resin composition, (5) mold package, (6) silica-based filler, and (7) fluorescent substance.

The optical semiconductor device which has its optical semiconductor element covered and protected with the cured product of the resin composition of the present invention exhibits good heat resistance, moisture resistance, and light resistance and hence keeps its substrate surface from discoloration by environmental effects. Thus the present invention provides a highly reliable optical semiconductor device, which is a great contribution to the industry.

EXAMPLES

The invention will be described in more detail with reference the following Examples and Comparative Examples, which are not intended to restrict the scope thereof. Incidentally, physical properties were measured by the methods explained below.

Viscosity: Measured according to JIS K 6249

Refractive index: The silicone composition was spin coated on a silicon wafer to form a film having about 10 μm thick, and was cured at 150° C. for 4 hours. The refractive index of the cured film measured by a prism coupler (Metricon Co., Ltd.; Model 2010).

Preparation of Silicone Composition

A silicone composition was prepared by thorough stirring from 100 parts by weight of dimethyldiphenylpolysiloxane with terminal vinyl groups having a viscosity of 3 Pa·s which is represented by the following formula (I):

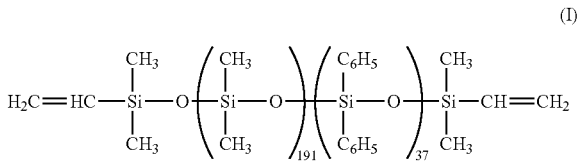
(I)

2.5 parts by weight of methylhydrogenpolysiloxane having a viscosity of 15 mPa·s which is represented by the following formula (II):

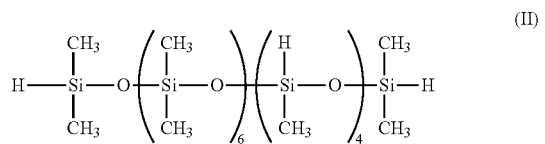
(II)

0.03 parts by weight of a solution of chloroplatinic acid modified with 2-ethylhexylalcohol,
0.05 parts by weight of ethynylcyclohexyl alcohol, and
7 parts by weight of 3-glycidoxypropyltrimethoxysilane.

The cured product of this silicone composition had a refractive index of 1.51.

Examples 1 and 2

In Example 1, 100 parts by weight of the silicone composition mentioned above was mixed with 30 parts by weight of cristobalite powder having a refractive index of 1.53 and a mean particle diameter of 5 μm and 5 parts by weight of YAG (fluorescent substance). The resulting composition was used to encapsulate the LED package shown in FIG. 1.

In Example 2, the foregoing procedure was repeated except that the amount of cristobalite powder was changed to 50 parts by weight.

Examples 3 and 4

In Example 3, 100 parts by weight of the silicone composition mentioned above was mixed with 10 parts by weight of cristobalite powder having a refractive index of 1.53 and 5 parts by weight of YAG. The resulting composition was used to encapsulate the LED package.

In Example 4, the foregoing procedure was repeated except that the amount of cristobalite powder was changed to 80 parts by weight.

Comparative Example 1

The above-mentioned silicone composition was used alone to encapsulate the LED package.

Comparative Examples 2 and 3

100 parts by weight of the above-mentioned silicone composition was mixed with 5 parts by weight of YAG and 10 parts by weight or 50 parts by weight of spherical silica filler having a refractive index of 1.46. The resulting composition was used to encapsulate the LED package.

The LED package which had been encapsulated with the liquid silicone composition mentioned above was kept at 150° C. for 4 hours so that the silicone composition was cured. Thus there was obtained the light-emitting diode for evaluation. The samples were allowed to stand at 85° C. and 60% RH for 168 hours and then passed through an IR reflow furnace at 260° C. three times. The cured resin was examined for defects (such as peeling and cracking) under a microscope. Ten samples free of peeling and cracking were tested for light emitting by application of 120 mA. The performance (heat generation and heat dissipation) of LED is usually expressed in terms of the temperature ($T_j$) of the PN junction the LED chip. The lower this temperature, the better the heat dissipation. The junction temperature ($T_j$), with current applied, was measured by using an LED thermal resistance measuring apparatus (made by Hitachi High-Technologies Corporation). The LED sample which had undergone light-emitting test was examined for thermal shock at −40° C. for 30 minutes and at 120° C. for 30 minutes (500 cycles). After thermal shock testing, the sample was examined for defects (such as peeling and cracking) under a microscope in the same way as mentioned above. In addition, the sample was allowed to stand in an atmosphere of 2% hydrogen sulfide for 48 hours, and then the sample was examined under a microscope for discoloration of silver plating on the package.

Evaluation of Dust Adhesion on the Surface to the Cured Product:

Tackiness of the surface of the cured product was evaluated by the touch. Then, the cured product was set into commercially available silver powder having a mean particle size of 5 μm. After the cure product was taken out, air was blown the cured product to judge whether or not the silver powder was blown out therefrom.

The samples in Examples 1 to 4 did not show any defect (such as peeling and cracking of resin) in reflow test and thermal shock test, neither did they suffer a defect of non-mitting. By contrast, the sample in Comparative Example 1 suffered resin cracking in the reflow test. The samples in Comparative Examples 2 and 3 suffered resin peeling although they did not suffer resin cracking, and some samples became incapable of emitting light.

TABLE 1

|  |  | Example | | | | Comparative Example | | |
| --- | --- | --- | --- | --- | --- | --- | --- | --- |
|  |  | 1 | 2 | 3 | 4 | 1 | 2 | 3 |
| Amount of filler added (pbw) | | 30 | 50 | 10 | 80 | 0 | 10 | 50 |
| Amount of YAG added (pbw) | | 5 | 5 | 5 | 5 | 0 | 5 | 5 |
| Dust on surface | | none | none | none | none | none | none | none |
| Reflow test | Occurrence of peeling | 0/50 | 0/50 | 0/50 | 0/50 | 0/50 | 40/50 | 45/50 |
|  | Occurrence of cracking | 0/50 | 0/50 | 0/50 | 0/50 | 50/50 | 0/50 | 0/50 |
| Thermal shock test | Occurrence of peeling | 0/50 | 0/50 | 0/50 | 0/50 | 0/50 | 40/50 | 40/50 |
|  | Occurrence of cracking | 0/50 | 0/50 | 0/50 | 0/50 | 50/50 | 0/50 | 0/50 |
| Light emission test | No light emission | 0/50 | 0/50 | 0/50 | 0/50 | 25/50 | 10/50 | 5/50 |
| Discoloration of silver plating in package | | None | None | Slight discoloration | None | Discoloration | Slight discoloration | None |

Japanese Patent Application No. 2009-283736 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resin composition for encapsulating an optical semiconductor element comprising a curable silicone rubber resin composition and a silica-based filler having a cristobalite structure, wherein
   a cured product of the curable silicone rubber composition has a refractive index of 1.4 to 1.6, and
   the silica-based filler has a refractive index of 1.45 to 1.55 and differs in refractive index within ±0.03 from the cured product of the curable silicone rubber resin composition and has a thermal conductivity of at least 0.5 W/m·K.

2. The resin composition of claim 1 which further comprises a fluorescent substance.

3. The resin composition of claim 2, wherein said fluorescent substance is a member of the group consisting of substances having the following formulas: $Y_3Al_5O_{12}$:Ce; $(Y,Gd,Tb)_3(Al,Ga)_5O_{12}$:Ce; $CaGa_2S_4$:$Ce^{3+}$; $SrGa_2S_4$:$Ce^{3+}$; $YAlO_3$:$Ce^{3+}$; $YGaO_3$:$Ce^{3+}$; $Y(Al, Ga)O_3$:$Ce^{3+}$; $Y_2SiO_5$:$Ce^{3+}$; and $A_3B_5O_{12}$:M, in which A is at least one element selected from the group consisting of Y, Gd, Tb, La, Lu, Se, and Sm, B is at least one element selected from the group consisting of Al, Ga, and In, and M is at least one element selected from the group consisting of Ce, Pr, Eu, Cr, Nd, and Er.

4. The resin composition of claim 1 wherein the content of the silica-based filler is 5 to 150 parts by weight for 100 parts by weight of the curable resin composition.

5. The resin composition of claim 1, wherein the silica-based filler having the cristobalite structure has a particle size of 0.01 to 75 μm and a sphericity of 0.8 to 1.0.

6. The resin composition of claim 1, wherein the curable resin composition is an addition-curable silicone rubber composition.

7. The resin composition of claim 1, wherein the curable silicone rubber composition consists of
   (A) an organopolysiloxane having two or more alkenyl groups in one molecule,
   (B) an organohydrogenpolysiloxane in an amount sufficient to provide 0.7 to 3.0 of SiH groups in component (B) per alkenyl group in component (A),
   (C) a platinum catalyst in an amount of 0.1 to 500 ppm in terms of platinum for 100 parts by weight of the total amount of components (A) and (B),
   (D) a reaction inhibitor in an amount of 1 to 10,000 ppm for the total amount of the addition curable silicone rubber composition, and
   (E) a silane coupling agent in an amount of no more than 10 wt % for the total amount of the addition curable silicone rubber composition.

8. The resin composition of claim 7, wherein the organopolysiloxane of component (A) is represented by the following general formula (1):

$$R^1R^2R^3SiO-(R^4R^5SiO)_a-(R^6R^7SiO)_b-SiR^1R^2R^3 \quad (1)$$

wherein
   $R^1$ denotes a monovalent hydrocarbon group having non-covalent double bonds,
   $R^2$ to $R^7$ denote identical or different monovalent hydrocarbon groups,
   each of $R^4$ to $R^7$ denotes a monovalent hydrocarbon group having no aliphatic unsaturated bond, and $R^6$ and/or $R^7$ denotes an aromatic monovalent hydrocarbon group, and
   a and b are integers defined by $10 \leq a+b \leq 500$; $10 < a \leq 500$; and $0 \leq b \leq 250$,
   the content of aromatic groups is 20 to 80 mol % of the total amount of monovalent hydrocarbon groups of $R^1$ to $R^7$.

9. The resin composition of claim 7 wherein the organopolysiloxane of component (A) is one represented by the following formulae:

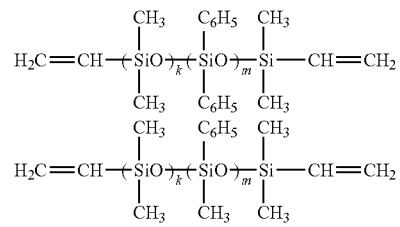

-continued

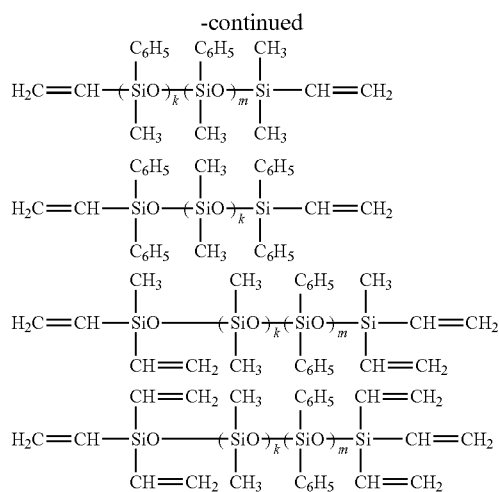

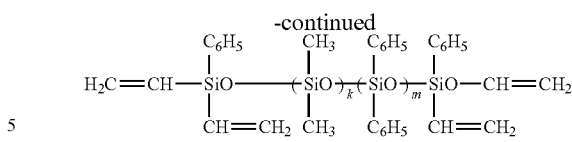

wherein k and m are integers that satisfy 5 <k+m ≤250, and 0 ≤m/(k+m)≤0.5.

10. An optical semiconductor device in which an optical semiconductor element is encapsulated with a cured product of the resin composition comprising a curable silicone rubber resin composition and a silica-based filler having a cristobalite structure, wherein a cured product of the curable silicone rubber composition has a refractive index of 1.4 to 1.6, and the silica-based filler has a refractive index of 1.45 to 1.55 and differs in refractive index within ±0.03 from the cured product of the curable silicone rubber resin composition and has a thermal conductivity of at least 0.5 W/m·K.

* * * * *